(12) United States Patent
Futatsugi et al.

(10) Patent No.: US 7,468,297 B2
(45) Date of Patent: Dec. 23, 2008

(54) METHOD OF MANUFACTURING SEMICONDUCTOR DEVICE

(75) Inventors: Toshiro Futatsugi, Hino (JP); Naoto Horiguchi, Kunitachi (JP); Ken-ichi Okabe, Akiruno (JP); Kenichi Hikazutani, Akiruno (JP)

(73) Assignee: Fujitsu Limited, Kawasaki (JP)

( * ) Notice: Subject to any disclaimer, the term of this patent is extended or adjusted under 35 U.S.C. 154(b) by 743 days.

(21) Appl. No.: 11/099,699

(22) Filed: Apr. 6, 2005

(65) Prior Publication Data
US 2005/0221556 A1    Oct. 6, 2005

(30) Foreign Application Priority Data
Apr. 6, 2004    (JP) .............................. 2004-111676

(51) Int. Cl.
*H01L 21/8242* (2006.01)

(52) U.S. Cl. ........................ 438/239; 438/238; 438/250; 257/296; 257/297

(58) Field of Classification Search ................. 438/238, 438/239, 250; 257/296, 297, 532
See application file for complete search history.

(56) References Cited

U.S. PATENT DOCUMENTS 6,764,930 B2 *   7/2004   Chu et al. .................... 438/528

* cited by examiner

*Primary Examiner*—Phuc T Dang
(74) *Attorney, Agent, or Firm*—Staas & Halsey LLP

(57) ABSTRACT

A method of manufacturing semiconductor device comprising forms a first impurity diffusion region as a lower electrode of a capacitor in a first area of a semiconductor substrate by implanting impurities at a first dose; forms a second impurity diffusion region in a second area, at the end part of the semiconductor substrate, by implanting impurities at a second dose; and forms, by a thermal oxidation method, a capacitor insulation film having a first thickness on the first impurity diffusion region and forms an oxide film having a second thickness which is thicker than the first thickness on the second area.

20 Claims, 11 Drawing Sheets

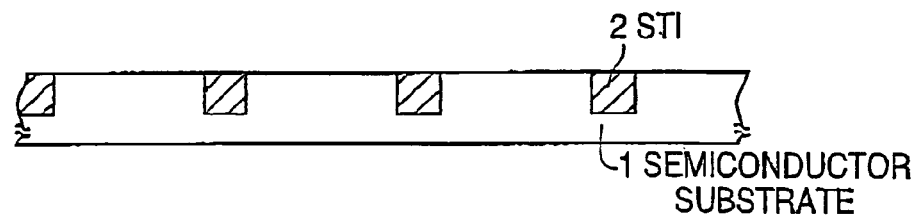
FIG. 1A
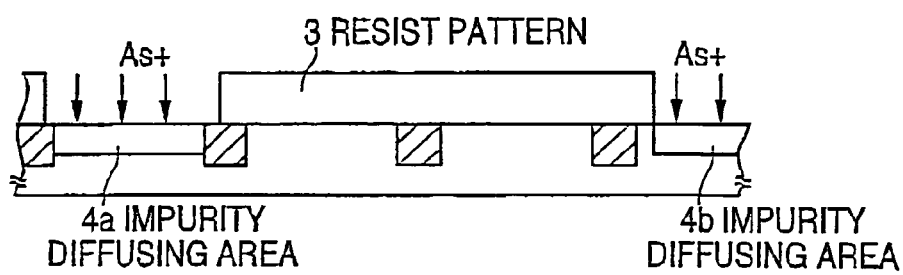
FIG. 1B
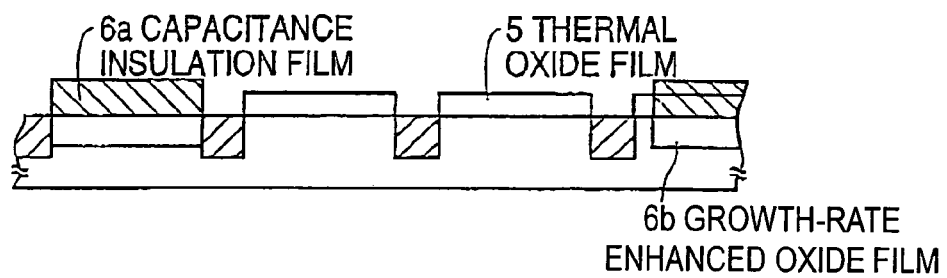
FIG. 1C
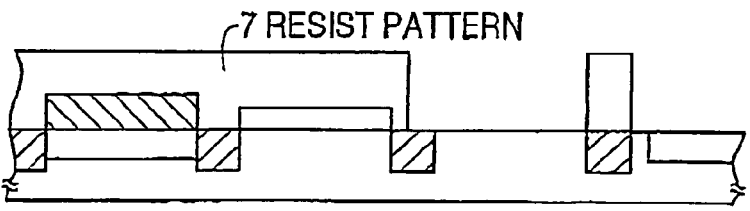
FIG. 1D

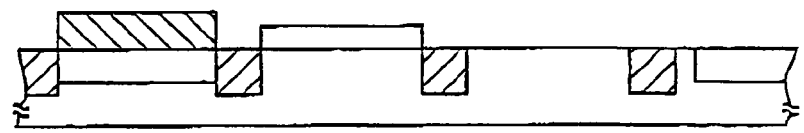
FIG. 1E
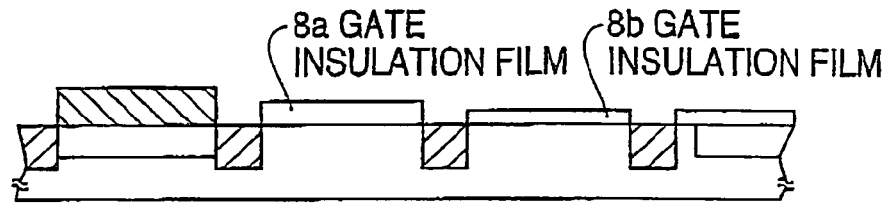
FIG. 1F
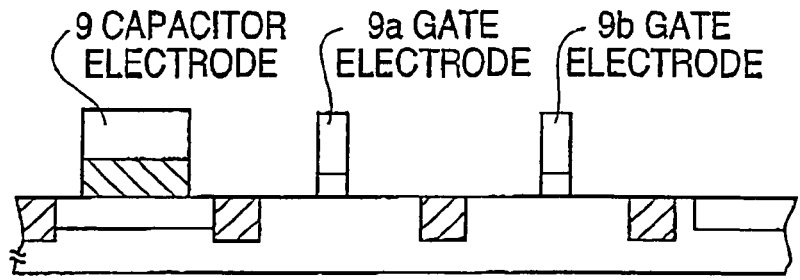
FIG. 1G

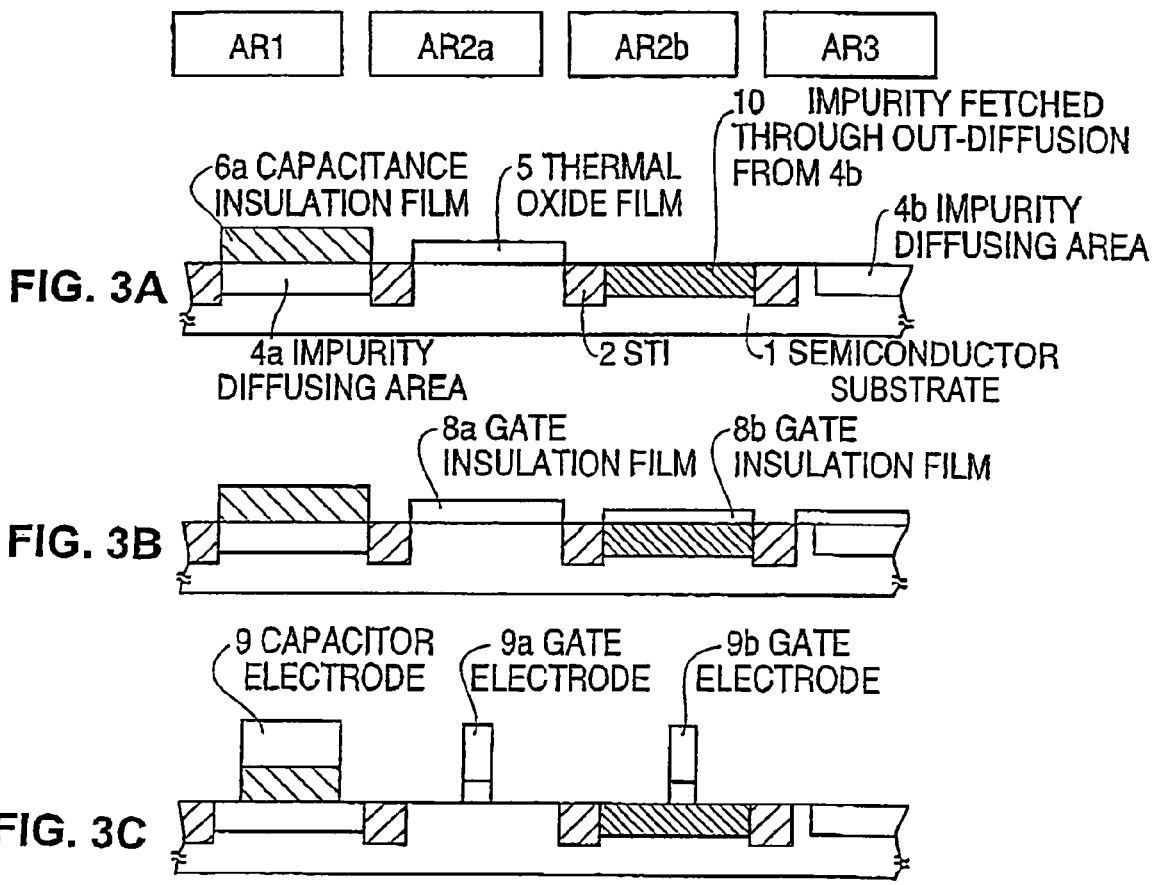

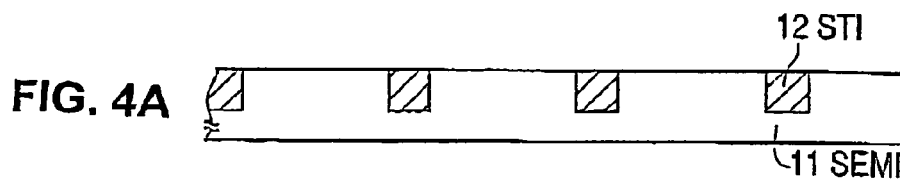
FIG. 4A
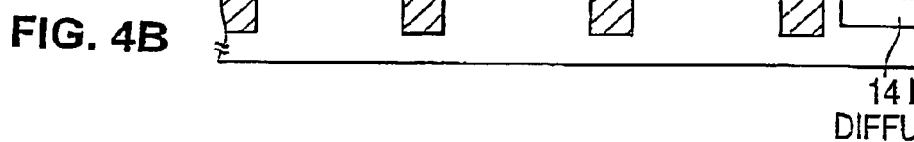
FIG. 4B
FIG. 4C
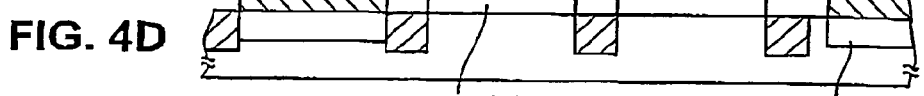
FIG. 4D

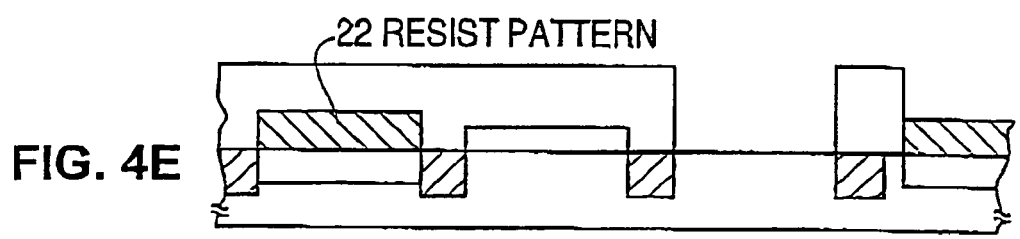
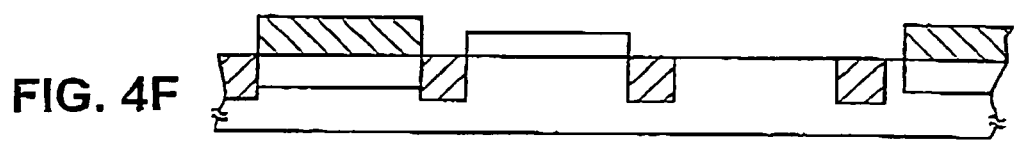
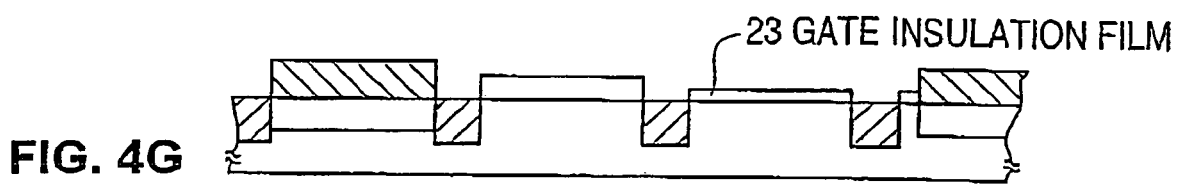
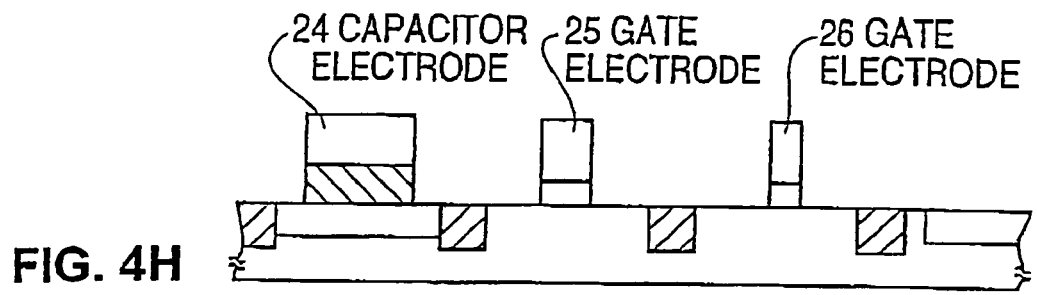

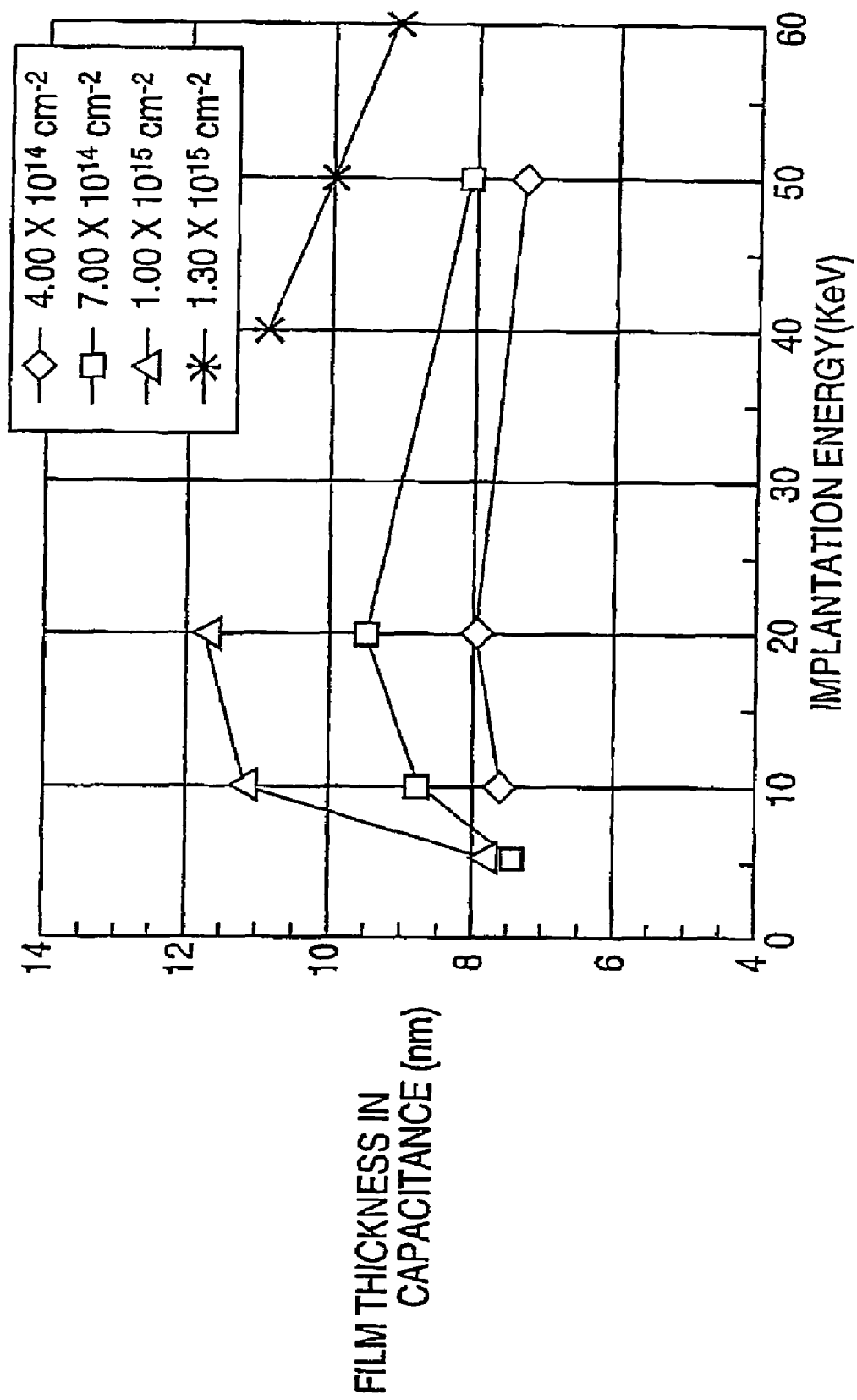

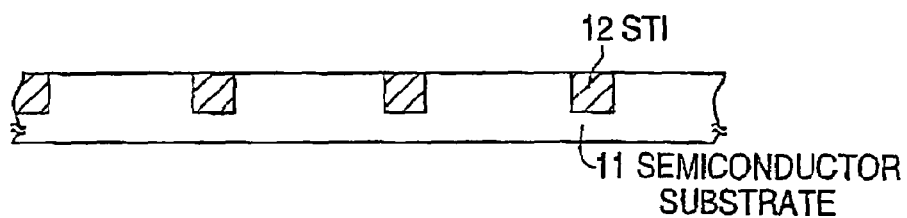
FIG. 9A
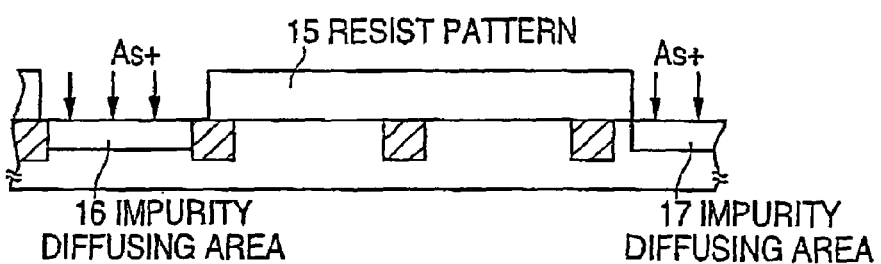
FIG. 9B
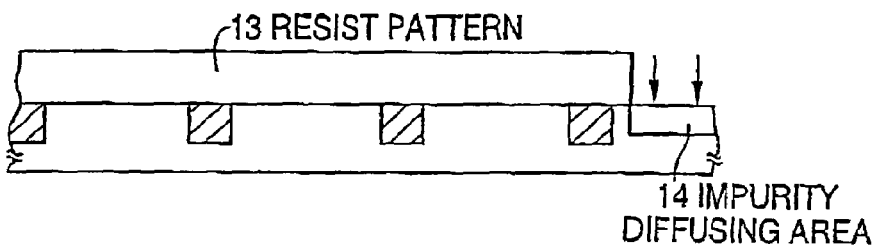
FIG. 9C
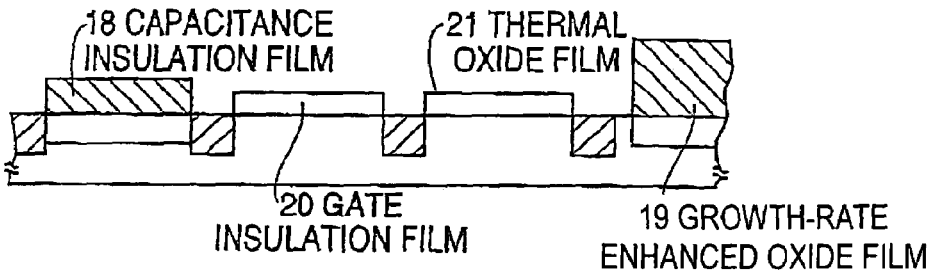
FIG. 9D

METHOD OF MANUFACTURING SEMICONDUCTOR DEVICE

CROSS-REFERENCE TO RELATED APPLICATIONS

This application is based upon and claims Priority of Japanese Patent Application No. 2004-11676, filed on Apr. 6, 2004, the contents being incorporated herein by reference.

BACKGROUND OF THE INVENTION

In miniaturizing semiconductor devices, shallow diffusion regions are formed and a method of manufacturing a transistor is more and more complicated. Moreover, it may also be required to form an analog circuit, a delay circuit, an integral circuit, and a capacitance element such as a memory cell capacitor in order to form a semiconductor integrated circuit.

As the capacitance element described above, a MIS capacitor is widely used under the condition that a semiconductor substrate in which impurities are doped to a higher concentration, is used as a lower electrode.

In this MIS capacitor, an impurity diffusion region which will become a lower electrode is formed by implanting impurity ions in the semiconductor substrate. Next, a capacitor insulation film is formed on the impurity diffusion region by a thermal oxidation method. Thereafter, an upper electrode of the MIS capacitor is formed by patterning polysilicon on a capacitor insulation film. The upper electrode is formed simultaneously with forming a gate polysilicon electrode of a MIS transistor Here, the impurity concentration for the lower capacitor electrode is higher by about 100 times than the impurity concentration for the ordinary MIS transistor channel and therefore a depletion layer is not easily formed in the semiconductor substrate. Accordingly, the capacitor impurity diffusion region has a merit that dependence of capacitance on voltage is extremely small. Moreover, since the thermal oxidation method is utilized, a comparatively thinner capacitor insulation film can be formed stably. Therefore, it is possible to obtain a capacitor which is suitable for an analog circuit, which requires higher accuracy and has a large capacitance per unit area. Moreover, since the capacitor is formed together with the MIS transistor, such capacitor can be manufactured at a low price.

The above described MIS capacitor is described, for example, in Japanese Published Unexamined Patent application No. 1996-97363 (Published on Apr. 12, 1996) Corresponding U.S. Pat. No. 5,973,381 A (Published on Oct. 26, 1999)

However, with further miniaturization of semiconductor devices, it is now difficult to improve both the characteristics of a gate insulation film and the characteristics of the capacitor insulation film because the MIS transistor and the MIS capacitor are simultaneously formed.

Thickness of the gate insulation film in the generation of 90 nm must be set to 2 nm or less. To form a thinner gate insulation film, which has a higher quality, it has been proposed to conduct hydrogen annealing before forming the gate insulation film. A thin naturally oxidized film formed on the surface of a semiconductor substrate can be removed by conducting hydrogen annealing and thereby an ultra-thin gate insulation film of the excellent film quality can be formed.

However, it has been proved that when the hydrogen annealing is utilized, excellent characteristics cannot be attained simultaneously in both devices only by simultaneously forming the MIS transistor and the MIS capacitor. Accordingly, it is required to provide a method of forming the MIS capacitor which can cover the progress in miniaturization.

SUMMARY OF THE INVENTION

Therefore, one possible object is to provide a method of manufacturing a semiconductor device including a gate insulation film and a capacitor insulation film of an excellent film quality.

The inventors propose a method of manufacturing a semiconductor device that includes a MIS transistor and a MIS capacitor having excellent characteristics. More specifically, the inventors propose forming a first impurity diffusion region which is a lower electrode of a capacitor to a first area of a semiconductor substrate by implanting impurity of a first dose, forming a second impurity diffusion region in a second area at the end part of the semiconductor substrate by implanting impurity of a second dose, and forming, with the thermal oxidation method, a capacitor insulation film having a first thickness on the first impurity diffusion region and forming an oxide film having a second thickness which is thicker than the first thickness on the second area.

The periphery edge of a wafer, outside of the integrated circuit, can be covered with an oxide film of the sufficient thickness because the additional impurity ion, which is suitable for enhancing the oxidation rate, is implanted in the periphery of wafer. Therefore, it can be controlled that impurity in the periphery of wafer is not out-diffused and is not fetched into the MIS transistor area during the hydrogen annealing. Accordingly, fluctuation of Vth in the MIS transistor can be reduced.

BRIEF DESCRIPTION OF THE DRAWINGS

These and other objects and advantages will become more apparent and more readily appreciated from the following description of the preferred embodiments, taken in conjunction with the accompanying drawings of which:

FIGS. 1A to 1G are cross-sectional views of processes illustrating the method of manufacturing a MIS transistor and a MIS capacitor.

FIGS. 3A to 3C are cross-sectional views of processes illustrating the method of manufacturing a MIS transistor and a MIS capacitor for describing out-diffusion by the hydrogen annealing.

FIGS. 4A to 4H are cross-sectional views of processes illustrating the method of manufacturing a semiconductor device based on the first embodiment of the present invention.

FIG. 5 is diagram illustrating dependence of the oxidation-rate enhanced film thickness on the implantation energy of arsenic ion.

FIGS. 9A to 9D are cross-sectional views of processes illustrating the method of manufacturing a semiconductor device based on the second embodiment of the present invention.

DETAILED DESCRIPTION OF THE PREFERRED EMBODIMENTS

Figure 2A:
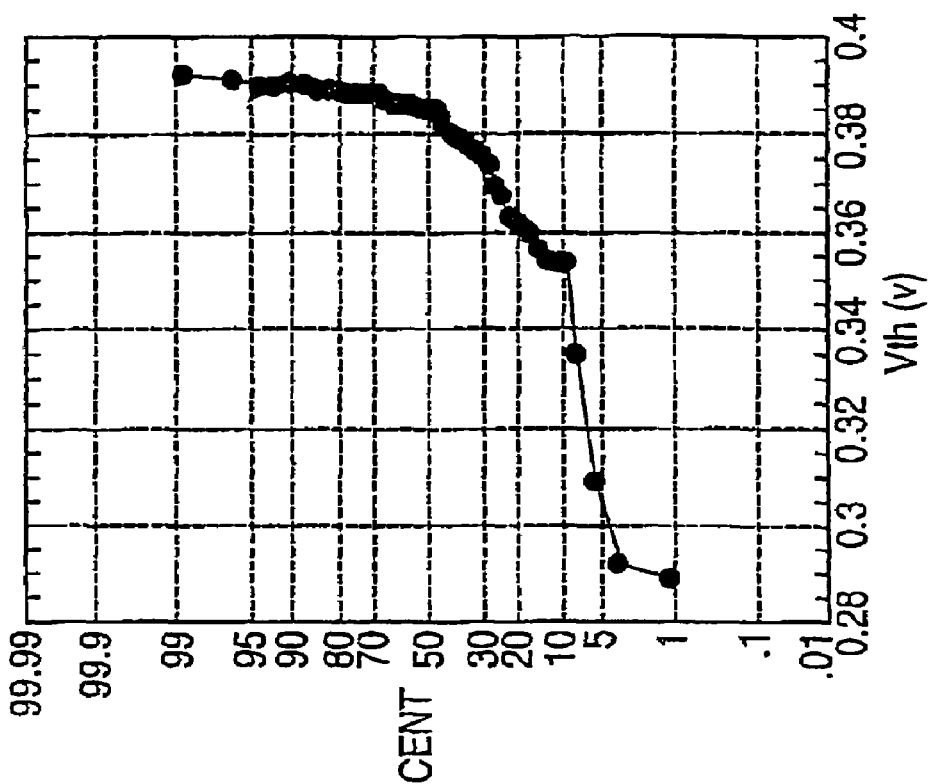
FIGS. 2A and 2B are cumulative probability graphs of Vth in n-channel MIS transistors.

First, the process using the hydrogen annealing as a pre-process before formation of a gate insulation film in the method of manufacturing semiconductor device including a MIS transistor and a MIS capacitor will be described with reference to FIG. 1. FIGS. 1A to 1G are cross-sectional views of the processes illustrating the method of manufacturing the MIS transistor and the MIS capacitor.

As illustrated in FIG. 1A, isolation 2 for defining a device region is formed on a semiconductor substrate 1. With the isolation 2, a MIS capacitor area AR1, a high voltage MIS transistor area AR2a such as I/O transistor, an ordinary MIS transistor area AR2b and a wafer peripheral area AR3 are defined. The isolation 2 can be formed, for example, with an STI (Shallow Trench Isolation) method.

Next, a p-well (not illustrated) is formed in the semiconductor substrate 1 in the area where an nMIS transistor is to be formed. The p-well is formed by ion implantation of a p-type impurity using the photolithography. Similarly, an n-well (not illustrated) is formed in the semiconductor substrate 1 in the area where a pMIS transistor is to be formed. The n-well is formed by ion implantation of an n-type impurity. Moreover, ions for controlling Vth are implanted in the semiconductor substrate 1 in the area where the nMIS transistor and the pMIS transistor are formed utilizing the photolithography.

As illustrated in FIG. 1B, an impurity diffusion region 4a which will become a lower electrode of a MIS capacitor is formed by ion implantation of arsenic using a resist pattern 3 based on the photolithography. In this case, in the periphery of wafer, the semiconductor substrate 1 is exposed in order to prevent contamination thereof at the time of clamping. Therefore, an n-type impurity diffusion area 4b is also formed simultaneously.

As illustrated in FIG. 1C, a thermal oxide film which will become a gate insulation film having a thickness of 5 nm is formed on the high voltage MIS transistor area AR2a with the wet oxidation in 800° C. In this case, the thermal oxide film 5 having the thickness of 5 nm is formed on the ordinary MIS transistor area AR2b, while a relatively thick capacitance insulation film 6a having a thickness of 10 nm is formed by growth-rate enhanced oxidation on the MIS capacitor area AR1, and the growth-rate enhanced oxide film 6b having a relative thickness of 10 nm is formed by the growth-rate enhanced oxidation on the surface of the wafer peripheral area AR3.

As illustrated in FIG. 1D, a resist pattern 7 for exposing the ordinary MIS transistor area AR2b and the wafer peripheral area AR3 is formed using the photolithography. In this case, at the peripheral area of wafer, the semiconductor substrate 1 is exposed with the peripheral exposure in order to prevent contamination due to the transfer of the wafer or the like as in the case of FIG. 1B. The thermal oxide film 5 and growth-rate enhanced oxide film 6b are removed using the aqueous solution of hydrofluoric acid using this resist pattern 7 as a mask.

As illustrated in FIG. 1E, the resist pattern 7 is removed using a chemical solution. Next, the semiconductor substrate 1 is washed with the process by the chemical solution such as SC1 and SC2. Moreover, the semiconductor substrate 1 is annealed under the hydrogen atmosphere for 10 seconds under the temperature of 900° C. to 1050° C. The native oxide film on the MIS transistor area AR2b and wafer peripheral area AR3 is removed under the hydrogen atmosphere. FIG. 1E shows the device after annealing in the hydrogen atmosphere.

As illustrated in FIG. 1F, a gate insulation film 8b having a thickness of 1.8 nm is formed in the ordinary MIS transistor area AR2b with the nitride process of the silicon oxide film in the nitric atmosphere. In this case, since the gate oxide film having a thickness of 5 nm is already formed on the high voltage MIS transistor area AR2a, the thickness of the oxide film 8a only increases by 1 nm or less.

As illustrated in FIG. 1G, a polycrystalline silicon layer is formed by a CVD method and it is then patterned in the predetermined gate electrode length. Therefore, an upper electrode 9 of the MIS capacitor, a gate electrode 9a of the high voltage resistance MIS transistor, and a gate electrode 9b of ordinary MIS transistor are formed.

Next, ion implantations in an extension area are performed using the gate electrodes 9a, 9b as masks, respectively. After formation of a side wall spacer (not illustrated), a high concentration source/drain area (not illustrated) is formed again by ion implantation of impurities. Thereafter, the gate electrode and source/drain electrodes are silicided and are covered with an interlayer insulation film (not illustrated). A lead-out electrode (not illustrated) is also formed respectively for the gate, source, and drain.

As described in FIG. 1E, the semiconductor substrate 1 is annealed in the hydrogen atmosphere as the pre-process before formation of the gate insulation film 8b. Therefore, a naturally oxidized film can be eliminated almost perfectly. Moreover, the surface of semiconductor substrate is flattened through the annealing of the semiconductor substrate in the hydrogen atmosphere and thereby the quality of the gate insulator can be improved.

However, it has also been proved that a problem that fluctuation in Vth of the ordinary MIS transistor becomes large when the hydrogen annealing technology is combined with the process to form the MIS capacitor to which the impurity diffusion area 4a is dope to a high concentration.

Figure 2B:
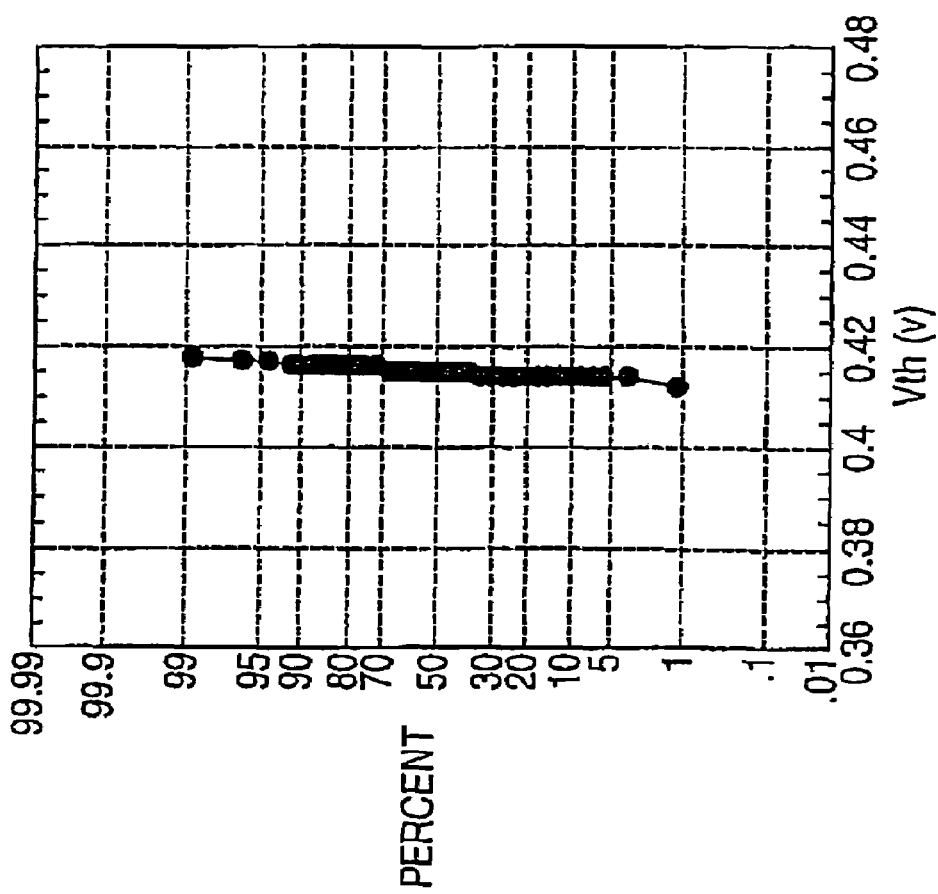

FIGS. 2A, 2B are diagrams illustrating the cumulative probability of Vth of the ordinary n-channel MIS transistor in the wafer surface. In this figure, the cumulative probability is plotted on the vertical axis, while Vth plotted is on the horizontal axis. The number of measuring points is 46 on the wafer surface. The gate length of the transistor is 1 μm and the gate width is 20 μm.

FIG. 2A illustrates the cumulative probability under the condition that the MIS capacitor is not formed, or that the arsenic ion is ion-implanted to the semiconductor substrate and then the hydrogen annealing is not performed in view of forming the MIS capacitor. FIG. 2B illustrates the cumulative probability under the condition that the arsenic ion is ion-implanted to the semiconductor substrate and then the hydrogen annealing is performed in view of forming the MIS capacitor.

As a result, in the case of FIG. 2A, Vth fluctuated by 10 mV or less. However, when the arsenic is implanted and the hydrogen annealing process has been performed as illustrated in FIG. 2B, it has been proved that the Vth of the n-channel MOS transistor at the periphery of wafer is shifted toward the lower direction and Vth fluctuated by about 100 mV or less.

Moreover, it has also been proved that the Vth of the peripheral area of wafer is shifted, in the case of the p-channel MIS transistor, toward the higher direction and Vth fluctuated by up to about 100 mV.

Moreover, this phenomenon is particularly noticeable in transistors having longer gate lengths. The reason is that, in transistors having longer gate lengths, Vth fluctuations are generally small. Vth fluctuations caused by forming the MIS capacitor become ambiguous with short gate length since these transistors usually have large fluctuations.

The inventors of the present invention have thought that such fluctuation of Vth is caused by the following phenomenon described below.

FIGS. 3A to 3C are cross-sectional views of the processes illustrating the phenomenon causing the Vth fluctuation. In these figures, the elements like those of FIG. 1 are designated with the like reference numerals and the description thereof is eliminated here.

As illustrated in FIG. 3A (this is the same process illustrated in FIG. 1E), a naturally oxidized film on the wafer peripheral area AR3 is removed by annealing the semiconductor substrate 1 in a hydrogen atmosphere under temperatures as high as 900° C. to 1050° C. Then the surface of semiconductor substrate 1 is exposed and the arsenic doped in the higher concentration in the area AR3 is diffused out and is then diffused into the ordinary MIS transistor area AR2b near to the periphery of the wafer. As a result, a channel layer 10 having an additional imparity concentration is formed in the ordinary MIS transistor area AR2b.

With the process illustrated in FIG. 3B, which is the same process in FIG. 1F, a gate insulation film 8b is formed in the ordinary MIS transistor area AR2b. Moreover, with the process illustrated in FIG. 3C, which is the same process shown in FIG. 1G, a gate electrode 9b is formed in the ordinary MIS transistor area AR2b.

In the ordinary MIS transistor, which is in the periphery of the wafer, Vth changes because of the additional arsenic impurity diffused into the channel layer 10. Accordingly, the value of Vth changes from that of the ordinary MIS transistor, which is located at the center of the wafer. Therefore, it is thought that fluctuations of Vth in the ordinary MIS transistor are generated due to arsenic out-diffusion during annealing in a hydrogen atmosphere as illustrated in FIG. 3A.

That is, it is thought that fluctuations in Vth at the wafer surface can also be suppressed if the change in the impurity concentration in the channel layer 10 due to out-diffusion of the arsenic can be suppressed.

First Embodiment

The method of manufacturing semiconductor device based on the first embodiment will be described with reference to FIGS. 4A to 4H. FIGS. 4A to 4H are cross-sectional views of processes illustrating the method of manufacturing semiconductor device based on the first embodiment.

First, as illustrated in FIG. 4A, isolation 12 for defining a device area is formed on a semiconductor substrate 11, for example, a silicon substrate. With this isolation area 12, a MIS capacitor area AR1, a high voltage MIS transistor area AR2a, which may serve as an I/O transistor, an ordinary MIS transistor area AR2b, which may serve as a high-speed transistor, and a wafer peripheral area AR3 are defined. The element isolation areas 12 can be formed, for example, with the STI method.

Next, with photolithography, a p-well (not illustrated) is formed within the semiconductor substrate 1 in the area where an nMIS transistor is formed by ion implantation of the p-type impurity. In the same manner, an n-well (not illustrated) is formed within the semiconductor substrate 1 in the area where a pMIS transistor is formed by ion implantation of the n-type impurity.

Moreover, with the photolithography technology, ion implantation for Vth control is respectively performed within the semiconductor substrate 1 in the area where the nMIS transistor and pMIS transistor are formed. In this case, the dose for ion implantation is set to about 0 to $3 \times 10^{13}$ cm$^{-2}$.

As illustrated in FIG. 4B, with the photolithography technology, an impurity diffusion area 14 is formed by selective ion implantation of impurities to the peripheral area of wafer using a resist pattern 13 as a mask. It is preferable that the ion implantation is performed, for example, under the conditions that the acceleration energy of arsenic ions is 10 keV to 30 keV and amount of implantation is $1 \times 10^{14}$ to $5 \times 10^{15}$ cm$^{-2}$. The resist is removed from the end part of the wafer, for example, the end 3.5 mm.

As illustrated in FIG. 4C, with the photolithography technology, an impurity diffusion area 16 which will become one electrode of a MIS capacitor is formed by ion implantation of impurity into the MIS capacitor area AR1 using the resist pattern 15 as the mask. It is preferable that ion implantation is performed, for example, under the conditions that the acceleration energy of arsenic ions is 30 keV to 100 keV and amount of implantation is $1 \times 10^{14}$ to $5 \times 10^{15}$ cm$^{-2}$. In this case, the semiconductor substrate 11 is exposed and the n-type impurity diffusion area 17 is formed simultaneously due to the exposure in the periphery of wafer. The resist is removed from the end part of wafer, for example, the end 1.5 mm.

Next, the resist pattern 15 is removed. Subsequently, implantation defects generated by the ion implantation described above are removed by annealing for 10 seconds under 1000° C. in a nitrogen atmosphere.

As illustrated in FIG. 4D, the semiconductor substrate 1 is oxidized with wet or dry oxidation under 700° C. to 1000° C. In this case, a thermal oxide film in the thickness of 5 nm which will become a gate insulating film 20 is formed in the MIS transistor area AR2a, while a thermal oxide film 21 in the thickness of 5 nm is formed in the area AR2b, a capacitance insulating film 18 in the thickness of 10 nm is formed in the MIS capacitor area AR1, and a relatively thick oxide film 19 in the thickness of 40 nm is formed in a wafer peripheral area AR3. Film 18 and film 19 are formed by growth-rate enhanced oxidation of the surface.

As illustrated in FIG. 4E, with the photolithography technology, a resist pattern 22 is formed to open the MIS transistor area AR2b and the wafer peripheral area AR3. In this case, in the wafer peripheral area, the semiconductor substrate 11 is exposed by peripheral exposure. The resist is removed from the end part of wafer is, for example, the end 3.5 mm.

Next, the thermal oxide film 21 is removed using an aqueous solution of hydrofluoric acid with the resist pattern 22 used as the mask. In this case, the growth-rate enhanced oxide film 19 at the surface of the wafer peripheral area AR3 is also etched, but the film 19 is reduced in thickness can be left because the growth-rate enhanced oxide film 19 is sufficiently thicker than the thermal oxide film 21. For example, it is preferable that the oxide film is left in the thickness of 5 nm or more.

As illustrated in FIG. 4F, the resist pattern 22 is removed using a chemical solution. For example, SPM is used as the chemical solution. Thereafter, processing by a chemical solution such as SC1, SC2 is performed. A native oxide film (not illustrated) is formed on the surface of the MIS transistor area AR2b in accordance with the chemical solution used.

Moreover, the semiconductor substrate 1 is annealed for about 10 seconds at 900° C. to 1050° C., for example, in a 100% hydrogen atmosphere with a pressure of 100 torr or less, for example, 20 torr. The native oxide film at the surface of the MIS transistor area AR2b can be removed under the hydrogen atmosphere. In this case, the thickness of the capacitance insulating film 18 formed previously is reduced by 0.05 nm or less. Moreover, in the MIS transistor area AR2b, the native oxide film is almost entirely removed, and if part of such native oxide film is left, the thickness is about 0.1 nm or less.

As illustrated in FIG. 4G, after a silicon oxide film is formed by wet or dry oxidation at a temperature of 700° C. to 1000° C., the silicon oxide film is subjected to processing under a nitrogen atmosphere. Thereby, a gate insulating film 23 is formed in the thickness of 1.8 nm on the ordinary MIS transistor area AR2b.

As illustrated in FIG. 4H, the polycrystalline silicon layer having a thickness of 50 nm to 200 nm is formed by the CVD method. Thereafter, with photolithography, the polycrystalline silicon layer is patterned to form a capacitor electrode 24 and gate electrodes 25, 26. Using the gate electrodes 25, 26 as a mask, ion implantations are performed into extension areas of the transistor, respectively. Moreover, after formation of the side wall spacer (not illustrated), impurity ions are implanted again to form the high concentration source/drain areas (not illustrated). Thereafter, the gate electrode and the source/drain electrodes are silicided and are covered with an interlayer insulation film (not illustrated) and lead-out electrodes (not illustrated) are respectively formed to the gate, source and drain.

The method of manufacturing semiconductor device of this embodiment is characterized in that the growth-rate enhanced oxidation for the peripheral area of wafer is utilized so that hydrogen annealing can be used as a preprocess to form the gate insulating film of the MIS transistor to which the impurity diffusion out of area 16 is suppressed.

Figure 6:
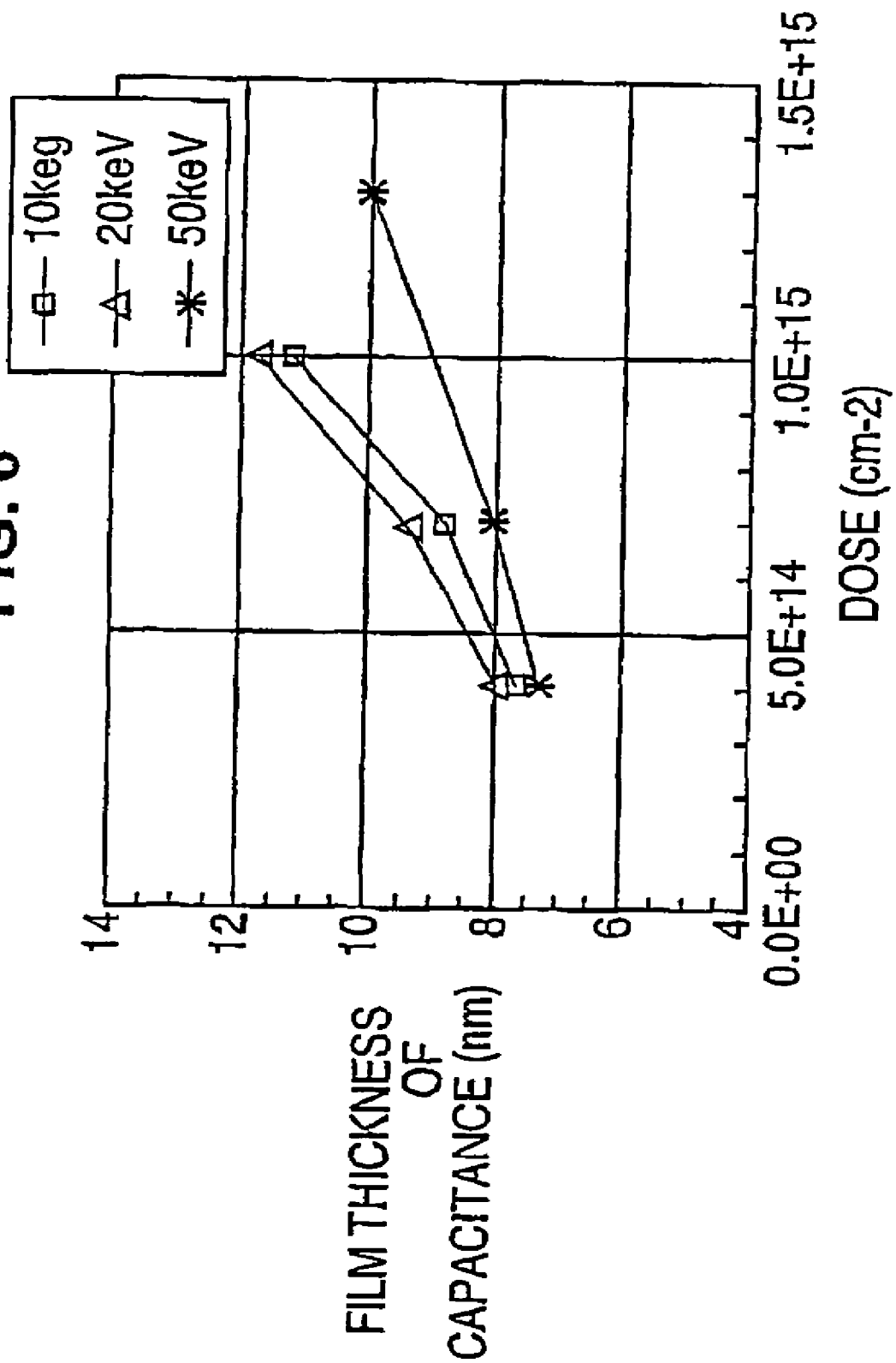
FIG. 6 is diagram illustrating dependence of the oxidation-rate enhanced film thickness on the implantation dose of arsenic ion.

FIG. 5 is a diagram illustrating the dependence of the growth-rate enhanced oxide film thickness on the implantation energy of arsenic ions. In this figure, film thickness of capacitance is plotted on the vertical axis and the implantation energy is plotted on the horizontal axis. FIG. 6 is a diagram illustrating the dependence of the growth-rate enhanced film thickness on the implantation amount of arsenic ions. In this figure, the vertical axis indicates film thickness of capacitance, while the horizontal axis indicates dose.

From FIGS. 5 and 6, it can be seen that in general, lower implantation energies produce higher impurity concentrations at the surface of semiconductor substrate and thereby the oxidation rate becomes higher. However, a sacrificial oxide film exists in almost all cases on the outermost surface of the wafer. Since the sacrificial oxide film has a thickness of about 10 nm at the outermost surface, if the implantation energy is too low, impurities are caught by the sacrificial oxide film and the oxidation rate is not enhanced. Therefore, it may be thought that the rate of oxidation is maximized when the implantation energy is about 20 keV. Moreover, larger doses of impurity ions increase the impurity concentration at the surface. As a result, the rate of oxidation is increased.

Accordingly, in above embodiment, n-type impurities are additionally implanted to a higher concentration at the peripheral part of wafer to form a thick growth-rate enhanced oxide film at the periphery of wafer. After the process of removing the thermal oxide film 21 described with reference to FIG. 4E, the growth-rate enhanced oxide film has a thickness which is enough for suppressing out-diffusion of the arsenic ions. Accordingly, out-diffusion of arsenic can be suppressed and fluctuations of Vth of the MIS transistor can be reduced.

(Result of Evaluation)

Figure 7:
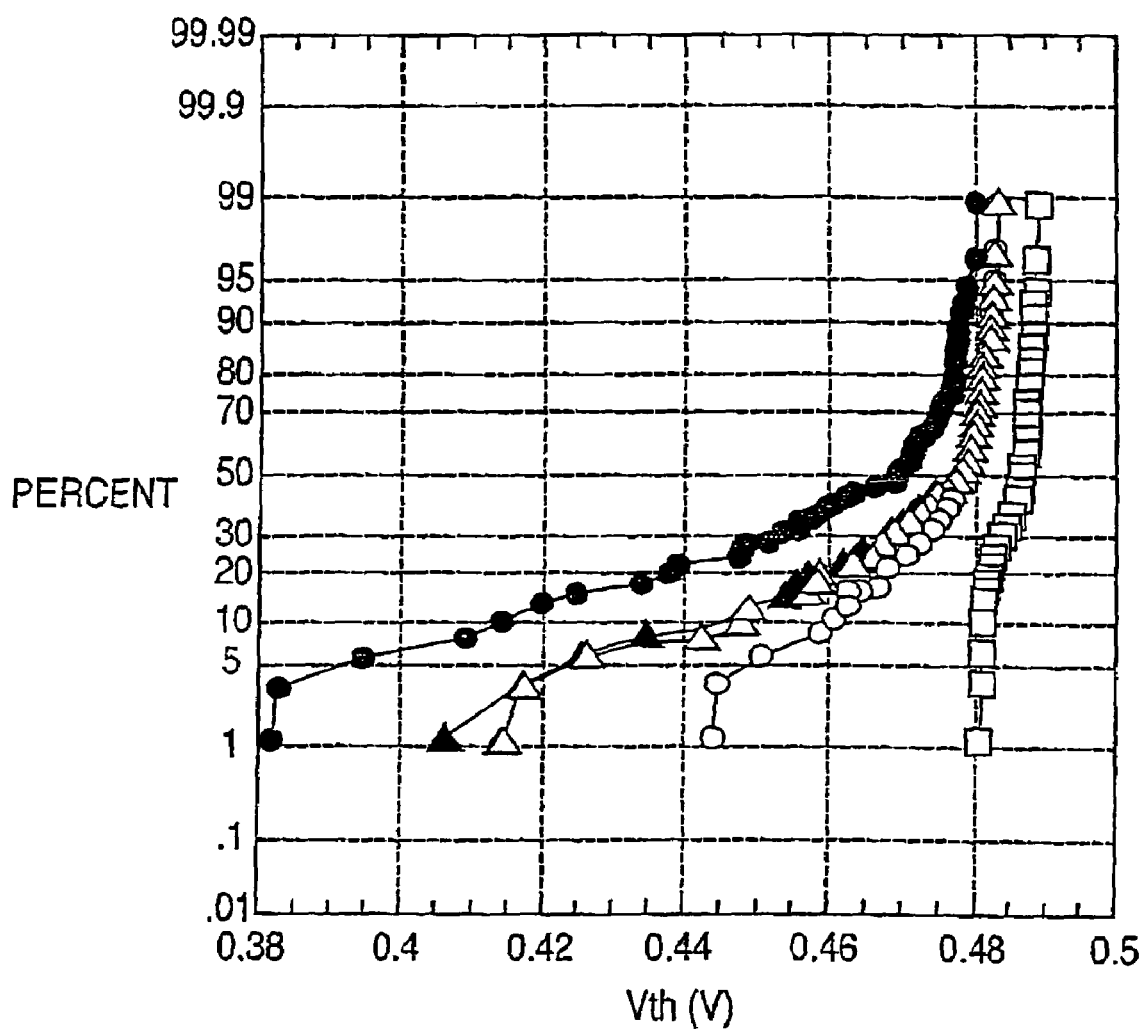
FIG. 7 is diagram illustrating results of cumulative probability within the wafer surface of Vth in an n-channel MOS transistor of the present invention.

FIG. 7 is a diagram illustrating cumulative probability within the wafer surface of Vth of the n-channel MIS transistor. In this figure, the cumulative probability is plotted on the vertical axis, and the Vth on the horizontal axis. Moreover, the values indicated by ● are obtained under the condition that the arsenic ion is not implanted to the peripheral area (implantation in FIG. 4B), while the values indicated by ▲ are obtained when the energy of arsenic ions is 50 keV and a dose of $1.3 \times 10^{15}$ cm$^{-2}$, the values indicated by ○ are obtained when an energy is 20 keV and a dose of $1.3 \times 10^{15}$ cm$^{-2}$, the values indicated by △ are obtained when the energy of arsenic ions is 10 keV and a dose of $1.3 \times 10^{15}$ cm$^{-2}$, and the values indicated by □ are obtained when the arsenic ion is not implanted to the periphery (implantation in FIG. 4B) or the hydrogen annealing is not performed. In the every condition, implantation of the arsenic ion of FIG. 4C is performed when the energy of arsenic ions is 50 keV and a dose of $1.3 \times 10^{15}$ cm$^{-2}$. The number of measuring points is respectively 46 within the wafer surface.

As a result, it has been proven that for the implantation of arsenic ion to the periphery of wafer, fluctuations of Vth can be minimized when the implantation energy is 20 keV, if the dose is constant.

Figure 8:
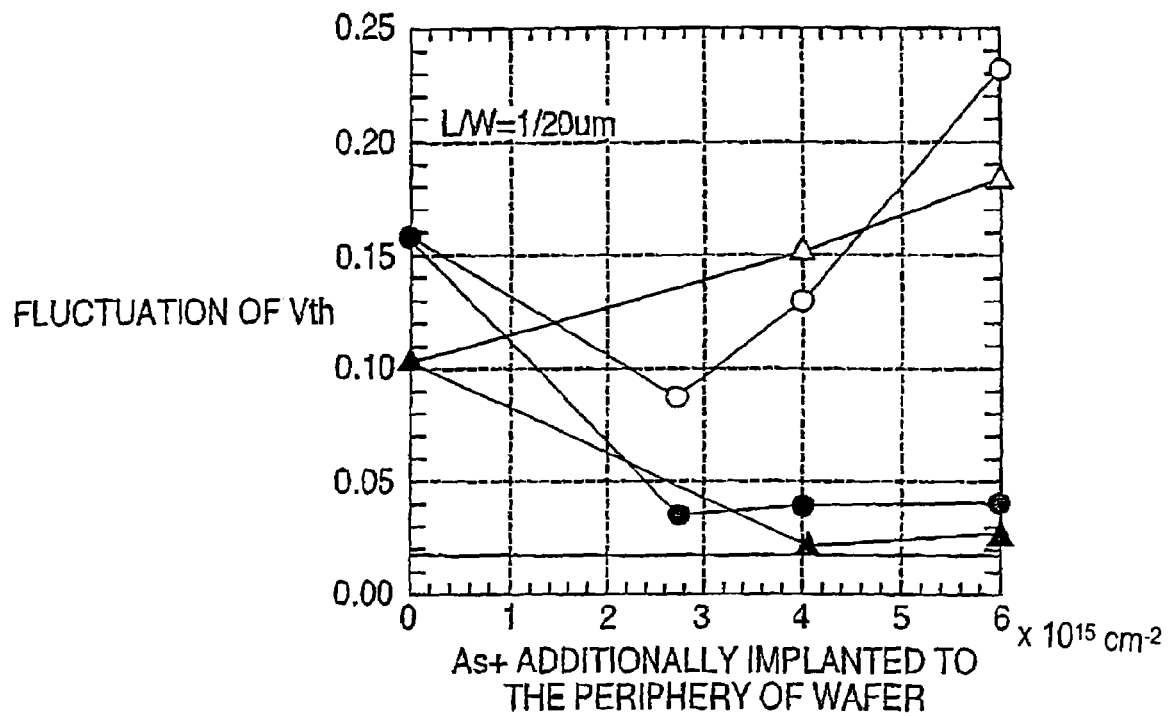
FIG. 8 is diagram illustrating the relationship between dose and fluctuation of Vth when the arsenic ion is implanted to the periphery of wafer.

FIG. 8 is a diagram illustrating the relationship between the dose and fluctuations in Vth when the arsenic ion is implanted to the periphery of wafer. In this figure, the vertical axis shows fluctuation ΔVth (MAX-MIN) of the Vth, while the horizontal axis shows the dose of arsenic ions additionally implanted to the periphery of wafer. Moreover, the values indicated by ● are obtained when the energy for implantation of arsenic ions to the periphery of wafer (implantation of FIG. 4B) is 20 keV and the resist removing area from the end part of wafer (exposure width in the periphery) is 3.5 mm, while the values indicated by ▲ are obtained when the energy for implantation of arsenic ions to the periphery of wafer is 20 keV and the resist removing area in the periphery is 1.5 mm, the values indicated by ○ are obtained when the energy for implantation of arsenic ions to the periphery of wafer is 50 keV and the resist removing area in the periphery is 3.5 mm, and the values indicated by △ are obtained when the energy for implantation of arsenic ions to the periphery of wafer is 50 keV and the resist removing area in the periphery is 1.5 mm. The horizontal line drawn in the lower area of the figure indicates fluctuations of Vth when the arsenic ion is not implanted in FIGS. 4B and 4C.

As a result, it has been proven that fluctuations of Vth can be suppressed sufficiently by setting the dose to $3 \times 10^{15}$ cm$^{-2}$ or more. When the resist removing area at the periphery of wafer indicated in FIG. 4C is set to 1.5 mm, fluctuations of Vth can be suppressed more effectively. When the resist removing area is 3.5 mm, it may be thought that the MIS transistor at the periphery of wafer being easily influenced.

Since the resist removing area at the periphery of wafer of FIG. 4B is set to 3.5 mm in the experiment of FIG. 8, if the positioning of resist in FIG. 4C does not coincide with the positioning of resist in FIG. 4B the oxide in some area in the periphery is not sufficiently thick, and the surface is exposed resulting in the possibility that out-diffusion of arsenic ions is generated easily. Meanwhile, when the resist removing area at the periphery of wafer of FIG. 4C is set to 1.5 mm, it may be thought that fluctuations in Vth are controlled because the oxide thickness in all areas of the periphery is sufficiently thick and the semiconductor surface is never exposed even if in the positioning of resist fluctuates.

MODIFICATION EXAMPLE

In the first embodiment, ion implantation is conducted once to form the MIS capacitor. However, the impurity diffusion layer may also be formed by conducting ion implantation several times.

For example, in the process of FIG. 4C, the arsenic ions can be implanted in two separate steps. First, the arsenic ion is implanted at a first implantation energy, for example, of 20 keV with the low dose of $7.25 \times 10^{14}$ cm$^{-2}$ in order to obtain the growth-rate enhanced oxide film of about 9 nm. Next, the arsenic ion is implanted at a second implantation energy of 50 keV which is higher than the first energy, with the dose of $2 \times 10^{14}$ cm$^{-2}$. Thereby, a final growth-rate enhanced oxide film thickness of 10 nm can be obtained. Accordingly, the sheet resistance of the lower electrode of the capacitor can be reduced to about a half of that when the implantation energy is 20 keV.

Namely, when the energy is 20 keV and the dose is increased, the growth-rate enhanced oxide film becomes too thick and the capacitance becomes small. However, when the energy is 50 keV, the oxidation rate is rather small and thereby the capacitance does not become small and the sheet resistance may be reduced by increasing the dose.

The total dose becomes rather small in comparison with that under the single high energy implantation condition described in the first embodiment, for example, the energy is 50 keV and dose is $1.3 \times 10^{15}$ cm$^{-2}$. Accordingly, the out-diffusion of the arsenic ion can be suppressed.

Second Embodiment

The method of manufacturing semiconductor device based on the second embodiment will be described with reference to FIG. 9. FIGS. 9A to 9D are cross-sectional views illustrating the method of manufacturing a semiconductor device of the present embodiment. In FIGS. 9A to 9D, the elements like those of FIGS. 4A to 4H are designated with the like reference numerals and the same description will be omitted here.

As illustrated in FIG. 9A, the STI is formed with the same method as that described in FIG. 4A. Namely, the isolation area 12 are formed to define the element areas on the semiconductor substrate 11. Next, both a p-well and an n-well (not illustrated) are formed through respective ion implantation of p-type and n-type impurities. Moreover, for Vth, control ions are also implanted into the semiconductor substrate 11 within the areas to which the nMIS transistor and pMIS transistor are formed.

As illustrated in FIG. 9B, with photolithography, the impurity diffusion area 16, which will become one electrode of the MIS capacitor, is formed by ion implantation of impurity to the MIS capacitor area AR1 using the resist pattern 15 as a mask. Ions may implant at the conditions, for example, that the acceleration energy of arsenic ions is 30 keV to 100 keV and the dose is $1 \times 10^{14}$ to $5 \times 10^{15}$ cm$^{-2}$. In this case, the resist is removed and the semiconductor substrate 11 is exposed in the periphery of wafer in order to prevent contamination at the time of clamping. The n-type impurity diffusion area 17 is also formed simultaneously in the periphery of wafer. The width of exposure of the semiconductor substrate 11 at the periphery of wafer is set, for example, to 1.5 to 3.0 mm from the edge of the wafer.

Next, the resist pattern 15 is removed. Subsequently, implantation defects generated in the ion implantation process described above are removed by annealing for 10 seconds in a nitrogen atmosphere, perhaps under a temperature of 700 to 1100° C., for example, under 1000° C.

As illustrated in FIG. 9C, with photolithography, the impurity diffusion area 14 is formed by implanting impurities to the periphery of wafer using the resist pattern 13 as a mask. Ion implantation may be performed under the conditions, for example, that the acceleration energy of arsenic ions is 10 keV to 30 keV and the dose is $1 \times 10^{14}$ to $5 \times 10^{15}$ cm$^{-2}$. In this case, the width of the exposed semiconductor substrate 11 at the periphery is set, for example, to 3.5 mm from the end part of the wafer.

As illustrated in FIG. 9D, the semiconductor substrate 11 is oxidized with wet or dry oxidation at 700° C. to 1000° C. In this case, a thermal oxide film having a thickness of 5 nm, which will become the gate insulating film 20, is formed in the MIS transistor area AR2a, the thermal oxide film having a thickness of 5 nm is formed in the AR2b, the capacitance insulation film 18 having a thickness of 10 nm is formed in the MIS capacitor area AR1 and the relatively thick oxide film 19 having a thickness of about 40 nm is formed by growth-rate enhanced oxidation in the wafer peripheral area AR3.

Next, the capacitor electrode 24 and gate electrodes 25, 26 are formed with a method similar to that described for FIGS. 4E to 4H. Subsequently, with the ordinary technology, the MIS transistor and MIS capacitor are formed.

According to this embodiment, arsenic ions are additionally implanted to the periphery of wafer after annealing to remove defects in the impurity diffusion layer which will become the lower electrode of the capacitor, defect in the periphery of wafer is not yet alleviated and the oxidation rate becomes large. Therefore, even when amount of implantation in the periphery of wafer is reduced, the effect equivalent to that of the first embodiment can also be obtained.

The present invention is not restricted the embodiments described above and allows various changes and modifications.

For example, in above embodiments, arsenic ions are described as the impurity ions for growth-rate enhanced oxidation, but it is also possible to use impurities of phosphorus, antimony or the like or a combination of two or more of such impurities.

Moreover, in the above embodiments, the n-type impurity diffusion layer has been used as the lower electrode of the MIS capacitor, but it is also possible to form such lower electrode with a p-type impurity diffusion layer.

Further, a 100% hydrogen gas atmosphere is described for the hydrogen annealing in above embodiments, but it is possible to reduce the concentration hydrogen gas with an inert gas such as He gas.

In addition, the gate insulating film of the high voltage MIS transistor has a thickness of 5 nm and the oxide film of the MIS capacitor has a thickness of 10 nm in above embodiments, but it is also possible to form these elements in different thicknesses. For example, the gate insulating film of the high voltage MIS transistor may have a thickness of 7 nm, and the oxide film of the MIS capacitor may have a thickness of 14 nm. Moreover, in the above embodiments, the growth-rate enhanced oxide film of the MIS capacitor is formed simultaneously with the gate insulating film of the high voltage MIS transistor, but the insulating film of the MIS capacitor can be formed independently.

What is claimed is:

1. A method of manufacturing a semiconductor device having an integrated circuit, comprising:
    forming a first impurity diffusion region in a first area of a semiconductor substrate by implanting impurities at a first dose;
    forming a second impurity diffusion region in a second area of the semiconductor substrate, outside of the integrated circuit, by implanting impurities at a second dose different from the first dose;
    electrically connecting the first impurity diffusion region to form a lower electrode of a capacitor; and
    using a thermal oxidation method to form a capacitor insulation film having a first thickness on the first impurity diffusion region and to form an oxide film having a second thickness which is thicker than the first thickness on the second area.

2. The method of manufacturing a semiconductor device according to claim 1, wherein impurities are implanted in the first area by a process comprising:
    implanting impurities at a first energy; and
    implanting impurities at a second energy which is higher than the first energy.

3. The method of manufacturing a semiconductor device according to claim 1, further comprising:
    annealing for removing defects caused by implantation, after forming the first impurity diffusion region.

4. A method of manufacturing semiconductor device comprising:
    implanting impurities in first and second areas of a semiconductor substrate using a first mask, the second area of the semiconductor substrate being outside of the integrated circuit;
    implanting impurities in the second area of the semiconductor substrate, but not the first area of the semiconductor substrate, using a second mask;
    electrically connecting the first area of the semiconductor substrate to form a lower electrode of a capacitor; and
    using a thermal oxidation method to form a capacitor insulation film having a first thickness on the first area of the semiconductor substrate and to form an oxide film having a second thickness thicker than the first thickness on the second area of the semiconductor substrate.

5. The method of manufacturing a semiconductor device according to claim 4, wherein
the second area of the semiconductor substrate is at an end of the semiconductor substrate, and
the first mask and the second mask are provided in different distances from the end of the semiconductor substrate.

6. The method of manufacturing a semiconductor device according to claim 4, wherein impurities are implanted in the first area by a process comprising:
implanting impurities at a first energy; and
implanting impurities at a second energy which is higher than the first energy.

7. The method of manufacturing a semiconductor device according to claim 4, further comprising:
annealing for removing defects caused by implantation, after forming the first impurity diffusion region.

8. A method of manufacturing semiconductor device comprising:
implanting impurities in first and second areas of a semiconductor substrate, the second area of the semiconductor substrate being outside of the integrated circuit;
implanting impurities in the second area of the semiconductor substrate, but not the first area of the semiconductor substrate;
electrically connecting the first area of the semiconductor substrate to form a lower electrode of a capacitor; and
using a thermal oxidation method to form a capacitor insulation film having a first thickness on the first area of the semiconductor substrate, to form a first oxide film having a second thickness which is thicker than the first thickness on the second area of the semiconductor substrate, and to form a second oxide film having a third thickness thinner than the first thickness on a third area of the semiconductor substrate.

9. The method of manufacturing a semiconductor device according to claim 8, further comprising:
forming a third oxide film, which is thinner than the capacitor insulation film, on a fourth area of the semiconductor substrate, the third oxide film being formed while forming the capacitor insulation film.

10. The method of manufacturing a semiconductor device according to claim 8, further comprising:
selectively removing the second oxide film after forming the second oxide film having the third thickness.

11. The method of manufacturing a semiconductor device according to claim 9, further comprising:
removing the second oxide film from the third area.

12. The method of manufacturing a semiconductor device according to claim 10, wherein
a part of the first oxide film is removed simultaneously with removal of the second oxide film; and
the semiconductor substrate is annealed in a hydrogen atmosphere after the second oxide film and a part of the first oxide film are removed.

13. The method of manufacturing a semiconductor device according to claim 12, wherein
before the thermal oxidation method, the substrate is annealed at a first temperature to remove defects caused by implanting impurities, and
the semiconductor substrate is annealed in the hydrogen atmosphere at a second temperature after the second oxide film and a part of the first oxide film are removed.

14. The method of manufacturing a semiconductor device according to claim 11, wherein
a part of the first oxide film is removed simultaneously with removal of the second oxide film; and
the semiconductor substrate is annealed in a hydrogen atmosphere after the second oxide film and a part of the first oxide film are removed.

15. The method of manufacturing a semiconductor device according to claim 14, wherein
before the thermal oxidation method, the substrate is annealed at a first temperature to remove defects caused by implanting impurities, and
the semiconductor substrate is annealed in the hydrogen atmosphere at a second temperature after the second oxide film and a part of the first oxide film are removed.

16. The method of manufacturing a semiconductor device according to claim 12, further comprising:
forming a gate insulation film on the third area of the semiconductor substrate after annealing the semiconductor substrate in the hydrogen atmosphere.

17. The method of manufacturing a semiconductor device according to claim 13, further comprising:
forming a gate insulation film on the third area after annealing the semiconductor substrate in the hydrogen atmosphere.

18. The method of manufacturing a semiconductor device according to claim 8, wherein
impurities are implanted in first and second areas of a semiconductor substrate using a first mask,
impurities are implanted in the second area of the semiconductor substrate, but not the first area of the semiconductor substrate using a second mask,
the second area of the semiconductor substrate is at an end of the semiconductor substrate, and
the first mask and the second mask are provided in different distances from the end part of the semiconductor substrate.

19. The method of manufacturing a semiconductor device according to claim 8, wherein impurities are implanted in the first area by a process comprising:
implanting impurities at a first energy; and
implanting impurities at a second energy which is higher than the first energy.

20. The method of manufacturing a semiconductor device according to claim 8, further comprising:
annealing for removing defects caused by implantation after forming the first impurity diffusion region.

* * * * *

UNITED STATES PATENT AND TRADEMARK OFFICE
CERTIFICATE OF CORRECTION

| | |
|---|---|
| PATENT NO. | : 7,468,297 B2 |
| APPLICATION NO. | : 11/099699 |
| DATED | : December 23, 2008 |
| INVENTOR(S) | : Toshiro Futatsugi et al. |

Page 1 of 1

It is certified that error appears in the above-identified patent and that said Letters Patent is hereby corrected as shown below:

Column 1, Line 8, change "2004-11676," to --2004-111676,--.

Signed and Sealed this

Twenty-fourth Day of March, 2009

JOHN DOLL
*Acting Director of the United States Patent and Trademark Office*